US012603034B2

(12) United States Patent (10) Patent No.: US 12,603,034 B2
Harada (45) Date of Patent: Apr. 14, 2026

(54) CMOS CIRCUIT

(71) Applicant: Magnolia White Corporation, Tokyo (JP)

(72) Inventor: Kenji Harada, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 160 days.

(21) Appl. No.: 18/477,555

(22) Filed: Sep. 29, 2023

(65) Prior Publication Data

US 2024/0112617 A1 Apr. 4, 2024

(30) Foreign Application Priority Data

Sep. 29, 2022 (JP) ................................. 2022-156207

(51) Int. Cl.
*G09G 3/20* (2006.01)
*H03K 19/0948* (2006.01)

(52) U.S. Cl.
CPC ....... *G09G 3/2092* (2013.01); *H03K 19/0948* (2013.01); *G09G 2300/0426* (2013.01); *G09G 2310/0267* (2013.01)

(58) Field of Classification Search
CPC ............. H03K 19/094; H03K 19/0948; H03K 19/168; H03K 19/17704; G09G 3/2092; G09G 2300/0426; H10D 86/40; H10D 86/60
See application file for complete search history.

(56) References Cited

U.S. PATENT DOCUMENTS

| | | | | |
|---|---|---|---|---|
| 4,176,372 A | * | 11/1979 | Matsushita | .......... H10D 84/858 |
| | | | | 257/E23.122 |
| 6,429,492 B1 | * | 8/2002 | Rockett | .............. H03K 19/0013 |
| | | | | 257/373 |
| 6,498,371 B1 | * | 12/2002 | Krishnan | ........... H03K 19/0948 |
| | | | | 438/154 |
| 8,212,311 B2 | * | 7/2012 | Masuoka | ............... H10D 84/85 |
| | | | | 257/E27.059 |
| 8,647,947 B2 | * | 2/2014 | Masuoka | ............... H10D 86/01 |
| | | | | 257/329 |
| 2010/0176395 A1 | * | 7/2010 | Choi | ...................... H10D 88/00 |
| | | | | 257/E29.1 |
| 2010/0295136 A1 | * | 11/2010 | Or-Bach | .............. H10D 84/038 |
| | | | | 257/390 |
| 2012/0196415 A1 | * | 8/2012 | Masuoka | ............... H10D 86/01 |
| | | | | 257/E21.41 |
| 2013/0153887 A1 | * | 6/2013 | Kaneko | ................ H10D 86/423 |
| | | | | 438/585 |
| 2015/0303217 A1 | * | 10/2015 | Tanaka | ................... H10D 87/00 |
| | | | | 257/43 |

(Continued)

FOREIGN PATENT DOCUMENTS

JP 2022-077412 A 5/2022

*Primary Examiner* — Jason M Crawford
(74) *Attorney, Agent, or Firm* — XSENSUS LLP

(57) ABSTRACT

According to one embodiment, a CMOS circuit includes a p-channel type transistor including a polycrystalline silicon layer and an n-channel type transistor including an oxide semiconductor layer, and the p-channel transistor and the n-channel transistor are complementarily connected to each other, and the polycrystalline silicon layer and the oxide semiconductor layer overlap each other in plan view.

4 Claims, 14 Drawing Sheets

(56) References Cited

U.S. PATENT DOCUMENTS

| | | | |
|---|---|---|---|
| 2016/0005763 A1* | 1/2016 | Masuoka ............... | H10D 84/85 |
| | | | 257/329 |
| 2016/0284862 A1* | 9/2016 | Yamazaki .............. | H10D 99/00 |
| 2020/0135772 A1* | 4/2020 | Lee ...................... | H10K 59/131 |
| 2022/0149202 A1* | 5/2022 | Takechi ............... | H10D 86/471 |
| 2022/0384433 A1* | 12/2022 | Ishizu ................... | H10D 84/08 |
| 2024/0055492 A1* | 2/2024 | Al .......................... | H10D 86/60 |
| 2024/0112617 A1* | 4/2024 | Harada ............... | H10D 86/471 |

* cited by examiner

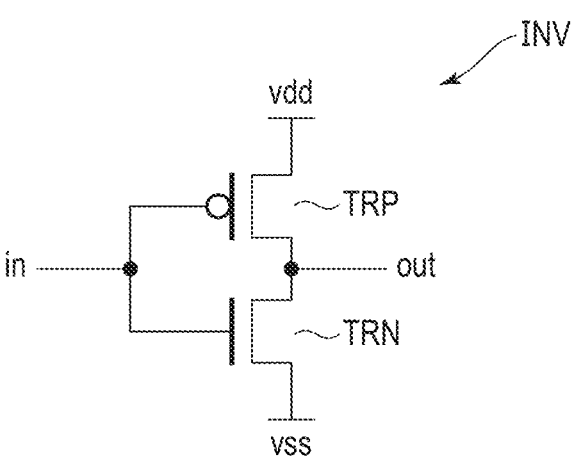
F I G. 2
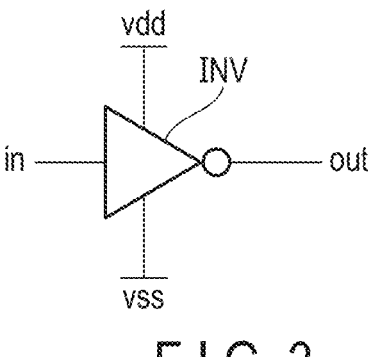
F I G. 3
F I G. 4

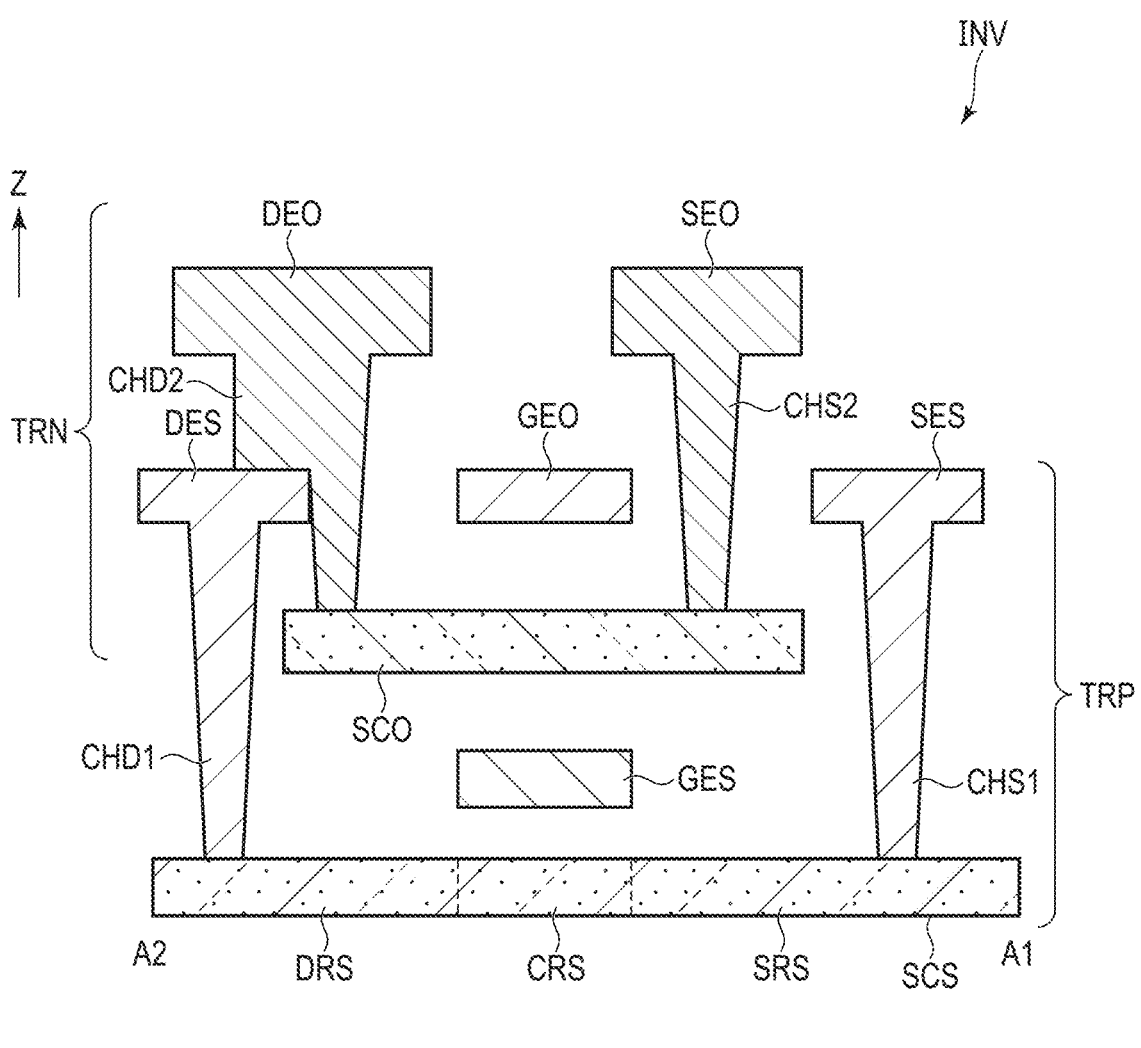
F I G. 6

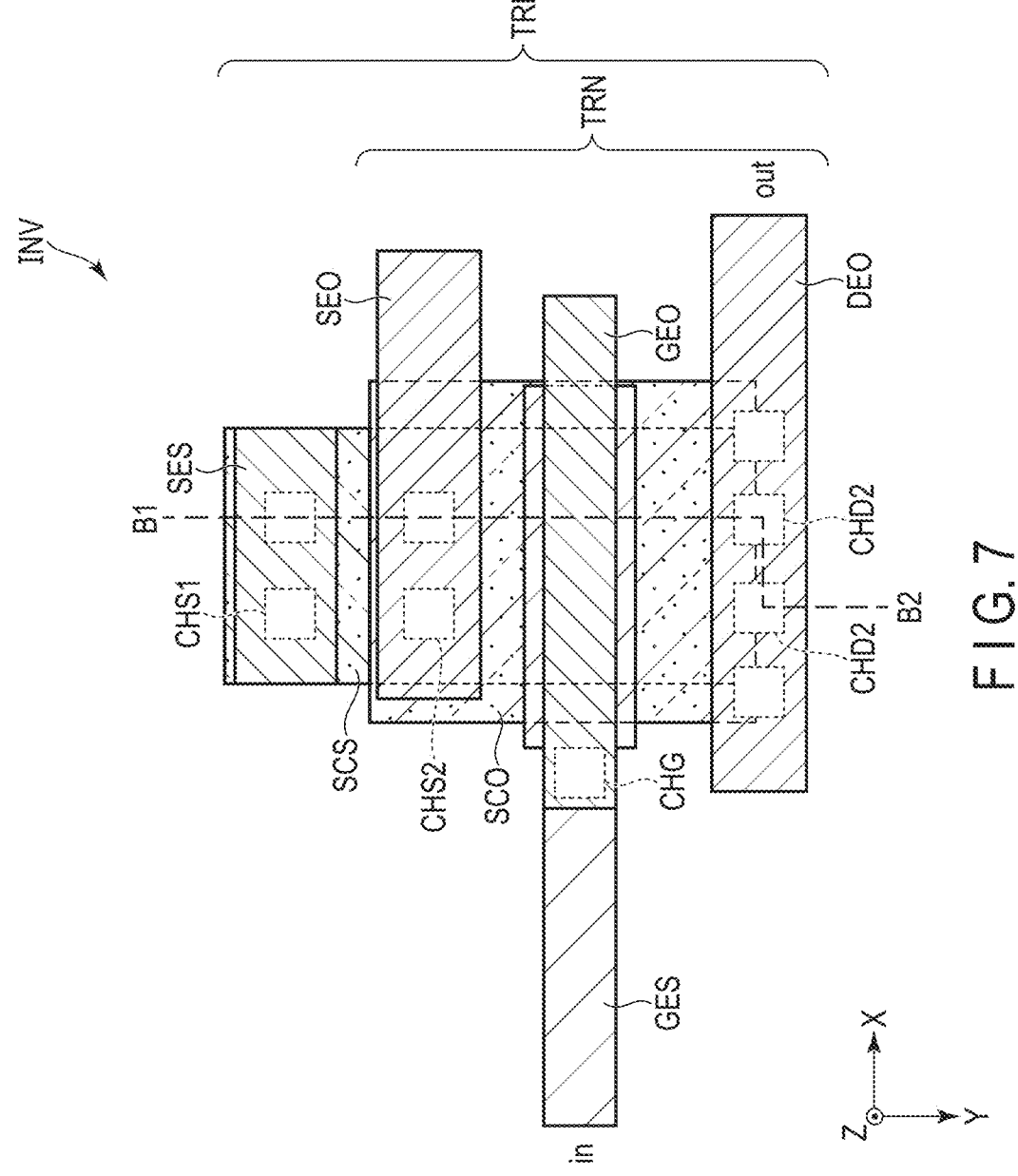
F I G. 7

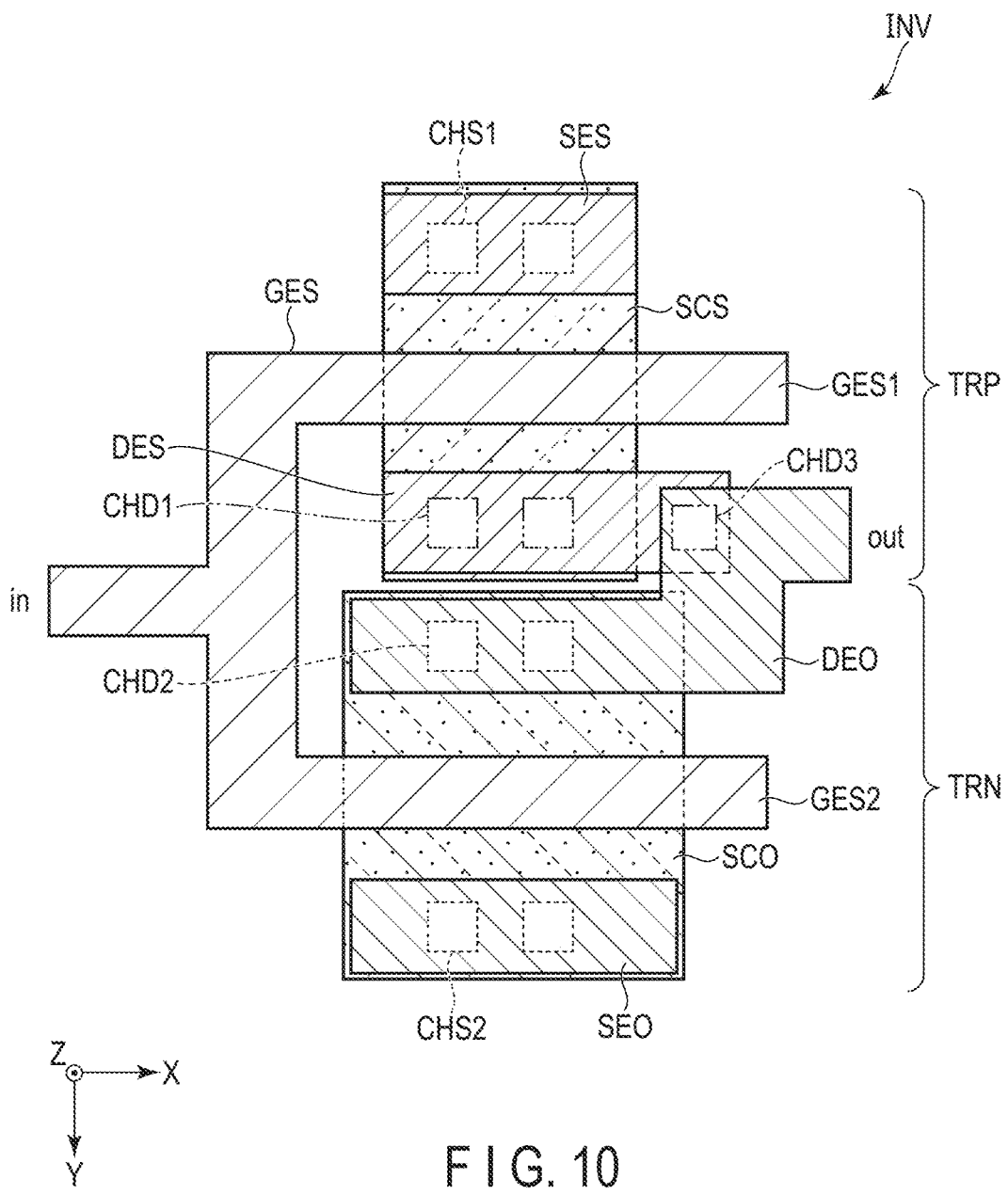
F I G. 10

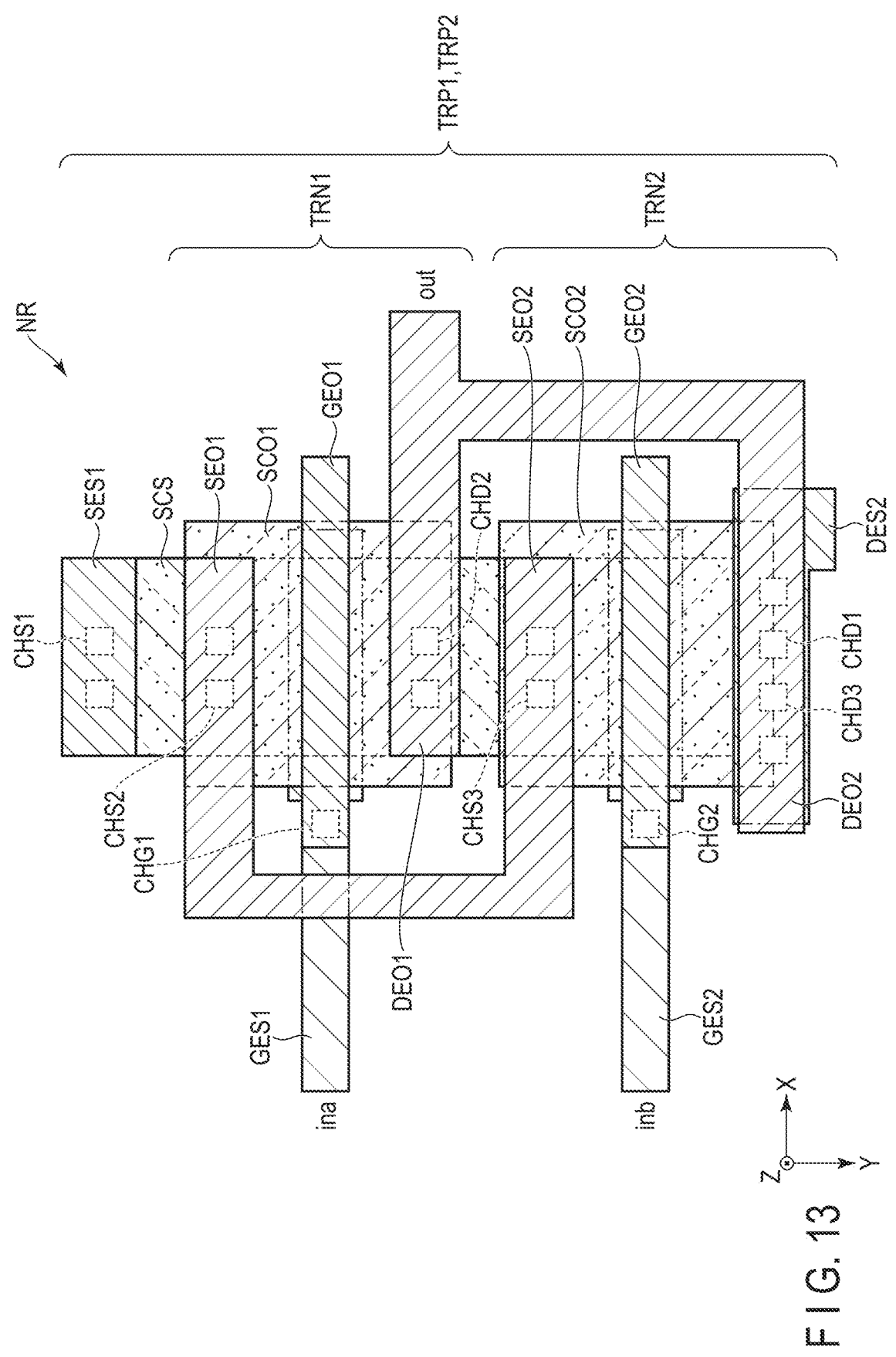
F I G. 13

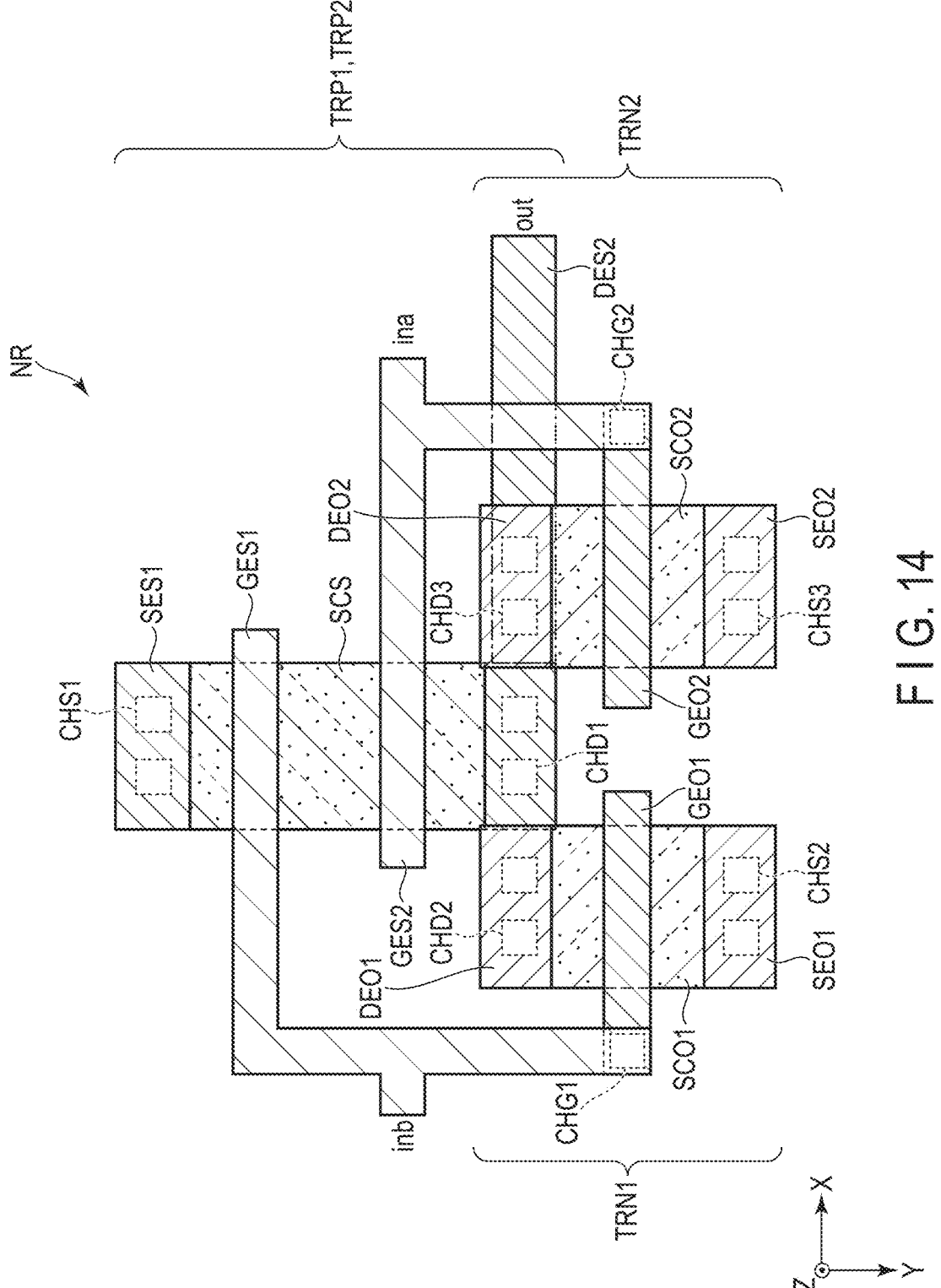
F I G. 14

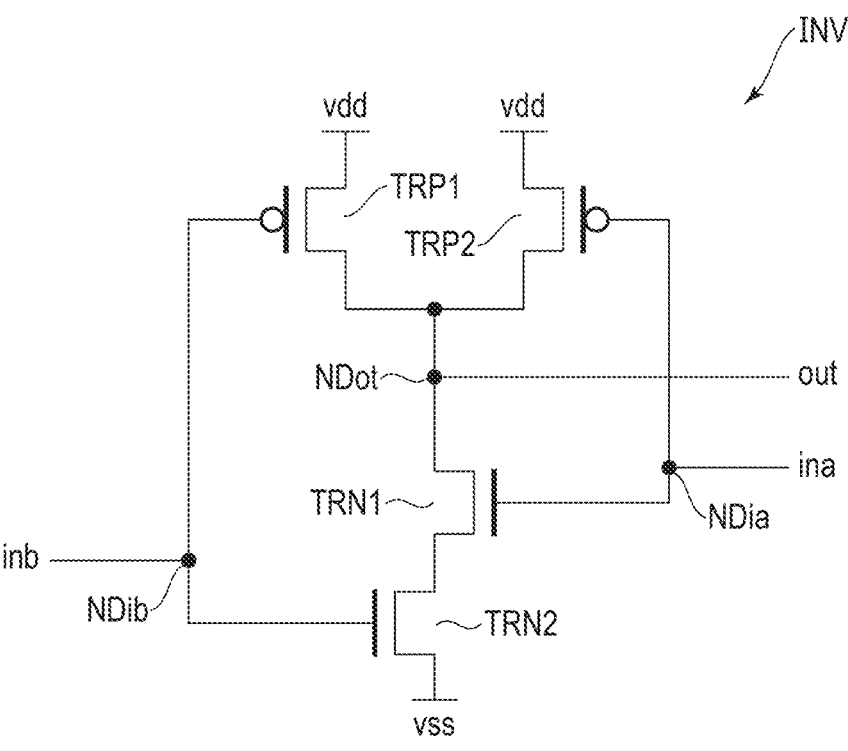
F I G. 15
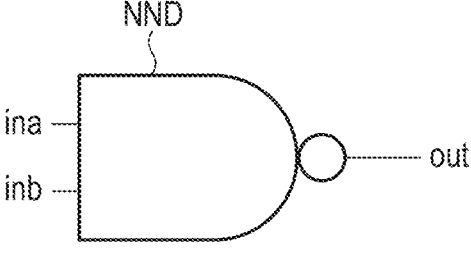
F I G. 16

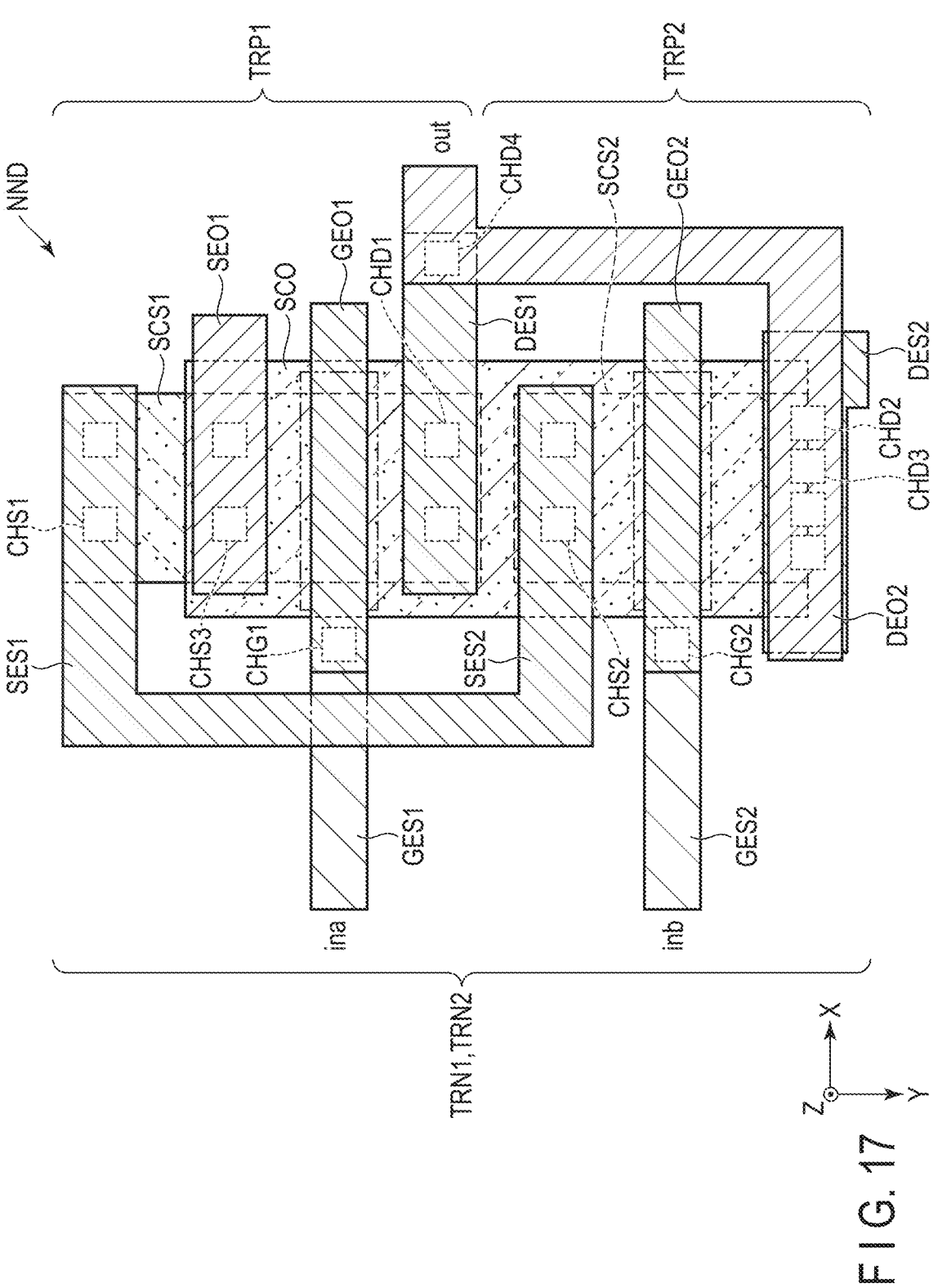
F I G. 17

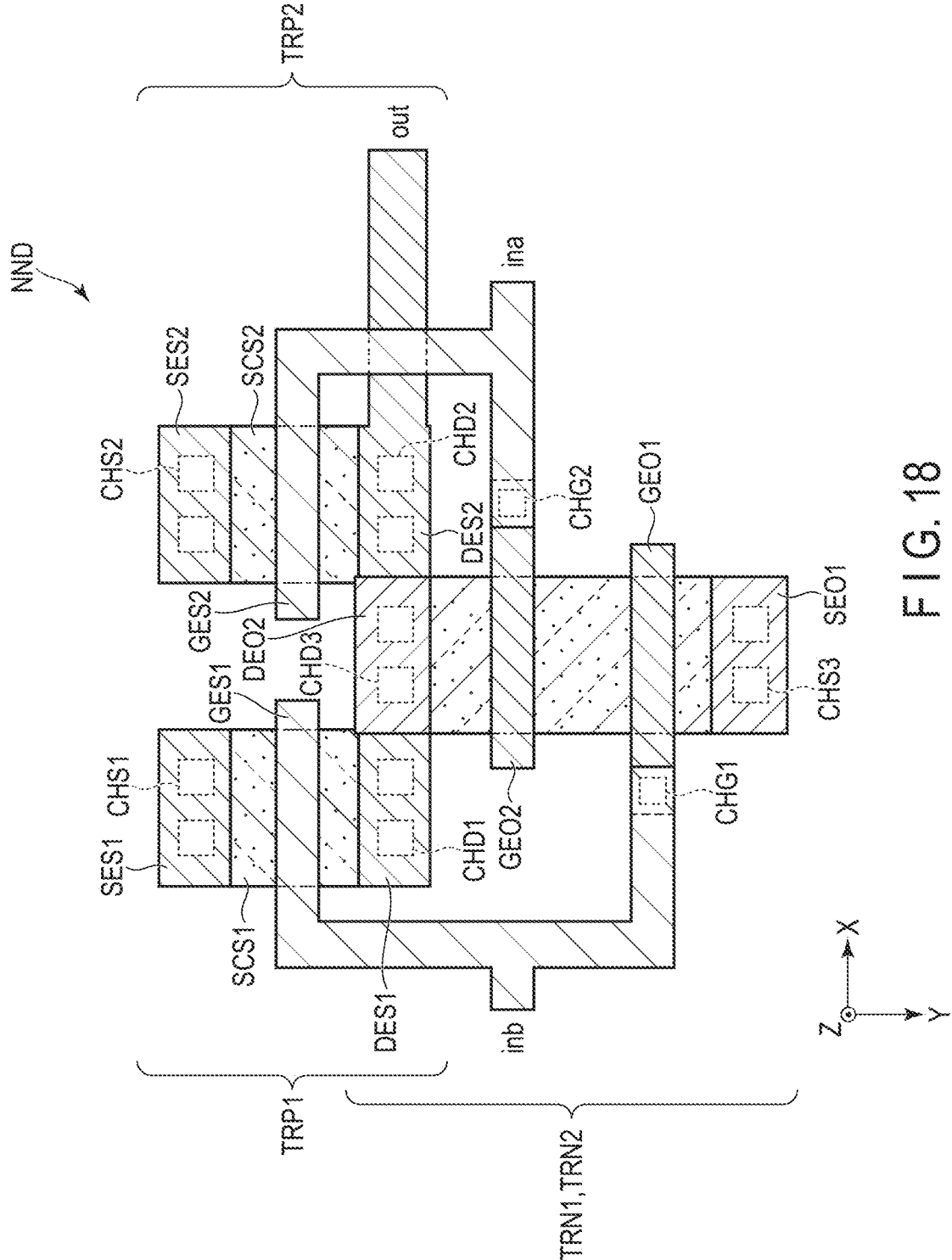
F I G. 18

CMOS CIRCUIT

CROSS-REFERENCE TO RELATED APPLICATION

This application is based upon and claims the benefit of priority from Japanese Patent Application No. 2022-156207 filed Sep. 29, 2022, the entire contents of which are incorporated herein by reference.

FIELD

Embodiments described herein relate generally to a CMOS circuit and a display device comprising the same.

BACKGROUND

Technology for incorporating a low-temperature polysilicon thin-film transistor (TFT) and an oxide semiconductor TFT in a single circuit has been put to practical use. For example, a pixel circuit containing a low-temperature polysilicon TFT and an oxide semiconductor TFT has been proposed.

BRIEF DESCRIPTION OF THE DRAWINGS

FIG. 2 is a circuit diagram schematically showing a configuration example of a CMOS circuit of Embodiment 1.

FIG. 3 is a diagram showing a circuit symbol of an inverter.

FIG. 4 is a diagram showing a circuit symbol of an inverter.

FIG. 6 is a cross-sectional view of the inverter taken along line A1-A2 shown in FIG. 5.

FIG. 7 is a plan view showing another configuration example of the inverter of Embodiment 1.

FIG. 10 is a plan view showing still another configuration example of the inverter in Embodiment 1.

FIG. 13 is a plan view showing a NOR gate of Embodiment 2.

FIG. 14 is a plan view showing another configuration example of the NOR gate of Embodiment 2.

FIG. 15 is a circuit diagram schematically showing a configuration example of a CMOS circuit of Embodiment 3.

FIG. 16 is a diagram showing a circuit symbol of a NAND gate.

FIG. 17 is a plan view showing a NAND gate of Embodiment 3.

FIG. 18 is a plan view showing another configuration example of the NAND gate in Embodiment 3.

DETAILED DESCRIPTION

Figure 1:
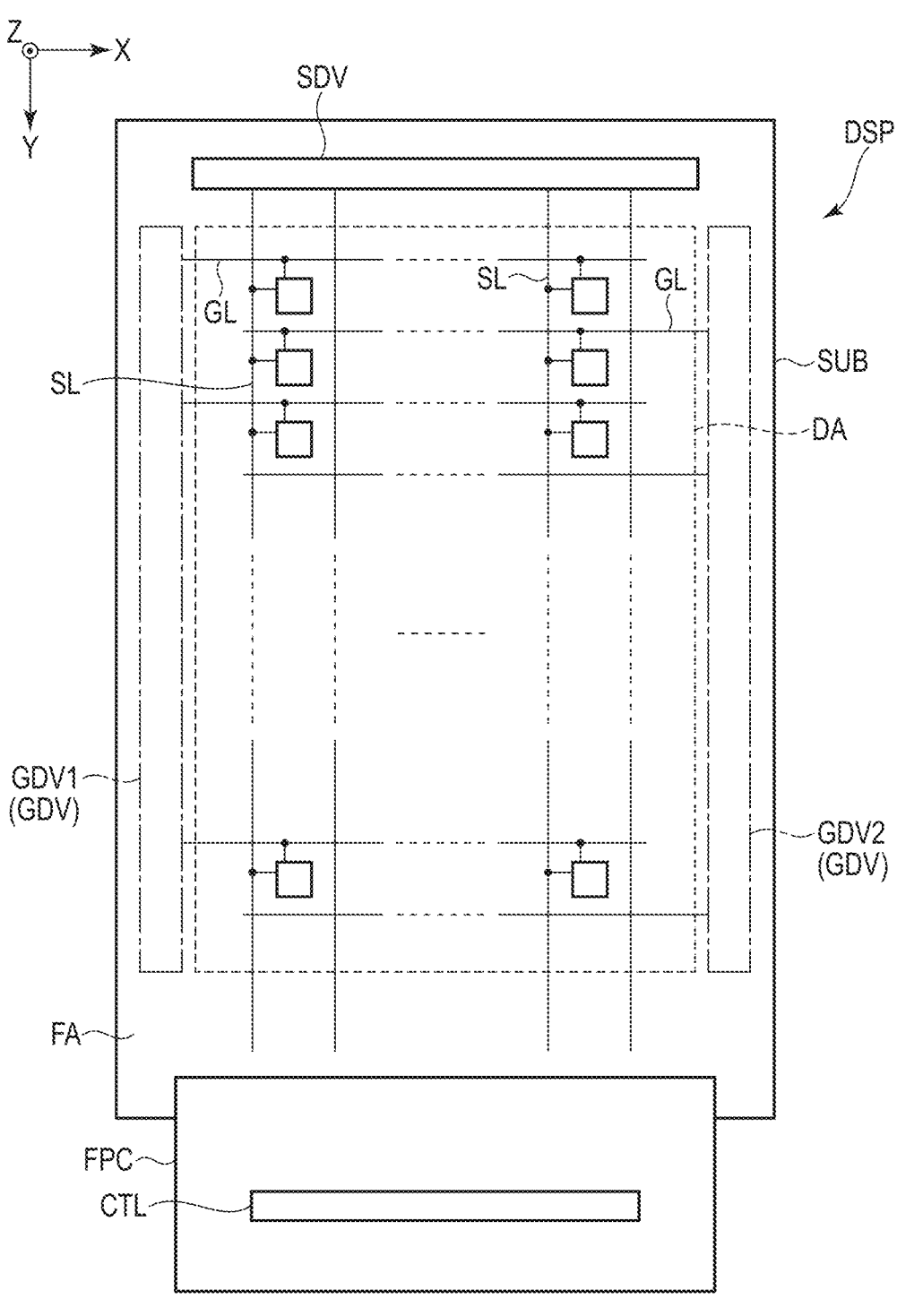
FIG. 1 is a plan view schematically showing a configuration example of a display device of Embodiment 1.

In general, according to one embodiment, a CMOS circuit comprises a p-channel type transistor including a polycrystalline silicon layer; and an n-channel type transistor including an oxide semiconductor layer, wherein the p-channel transistor and the n-channel transistor are complementarily connected to each other, and the polycrystalline silicon layer and the oxide semiconductor layer overlap each other in plan view.

One of the objects of this embodiment is to provide a CMOS circuit and a display device for which the manufacturing time and manufacturing cost can be reduced.

Further, according to the embodiment, it is possible to obtain a CMOS circuit with a reduced circuit area.

Furthermore, according to this embodiment, it is possible to obtain a high-performance CMOS circuit with a fast switching response.

Embodiments will be described hereinafter with reference to the accompanying drawings. Note that the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the same or similar elements as or to those described in connection with preceding drawings or those exhibiting similar functions are denoted by like reference numerals, and a detailed description thereof is omitted unless otherwise necessary.

The embodiments described herein are not general ones, but rather embodiments that illustrate the same or corresponding special technical features of the invention. The following is a detailed description of one embodiment of a CMOS circuit with reference to the drawings.

In this embodiment, a first direction X, a second direction Y and a third direction Z are orthogonal to each other, but may intersect at an angle other than 90 degrees. The direction toward the tip of the arrow in the third direction Z is defined as up or above, and the direction opposite to the direction toward the tip of the arrow in the third direction Z is defined as down or below. Note that the first direction X, the second direction Y and the third direction Z may as well be referred to as an X direction, a Y direction and a Z direction, respectively.

With such expressions as "the second member above the first member" and "the second member below the first member", the second member may be in contact with the first member or may be located away from the first member. In the latter case, a third member may be interposed between the first member and the second member. On the other hand, with such expressions as "the second member on the first member" and "the second member beneath the first member", the second member is in contact with the first member.

Further, it is assumed that there is an observation position to observe the CMOS circuit on a tip side of the arrow in the third direction Z. Here, viewing from this observation position toward the X-Y plane defined by the first direction X and the second direction Y is referred to as plan view. Viewing a cross-section of the CMOS circuit in the X-Z plane defined by the first direction X and the third direction Z or in the Y-Z plane defined by the second direction Y and the third direction Z is referred to as cross-sectional view.

Embodiment 1

FIG. 1 is a plan view schematically showing a configuration example of a display device of Embodiment 1. In a display device DSP shown in FIG. 1, a substrate SUB1 comprises a display area DA, a peripheral area FA surrounding the display area DA, scanning line drive circuits GDV (a scanning line drive circuit GDV1 and a scanning line drive circuit GDV2) and a signal line drive circuit SDV provided in the peripheral area FA.

The display area DA includes a plurality of pixels PX, and the plurality of pixels PX are arranged in a matrix. Each of the plurality of pixels PX is provided at an intersection between each of a plurality of scanning lines GL and each respective one of a plurality of signal lines SL. Each of the plurality of pixels PX is connected to the corresponding scan line GL and signal line SL.

The peripheral area FA is an area on an outer side of the display area DA. In the peripheral area FA includes, the scanning line drive circuits GDV (GDV1 and GDV2), the signal line drive circuit SDV, and a wiring board FPC that is connected thereto via terminals (not shown) are located. In the example shown in FIG. 1, scanning lines GL extends from the scanning line drive circuit GDV. The odd-numbered scanning lines GL are connected to the scanning line drive circuit GDV1. The even-numbered scanning lines GL are connected to the scanning line drive circuit GDV2. Note here that the scanning line drive circuit does not necessarily have to be divided into two, but all scanning lines GL may be connected to one scanning line drive circuit. Signal lines SL extend from the signal line drive circuit SDV. A drive elements CTL is provided on the wiring board FPC. The drive element CTL is, for example, a driver IC.

Video signals and various types of control signals are supplied from outside the display unit DSP via the wiring board FPC. The video signals are input to the plurality of pixels PX via the drive elements CTL, respectively. The various drive signals are input to the scanning line drive circuit GDV and the signal line drive circuit SDV via the drive elements CTL. Based on the video signals and various control signals, the pixels PX emit light.

The scanning line drive circuit GDV, the signal line drive circuit SDV and the pixels PX shown in FIG. 1 each may comprise a CMOS circuit. The CMOS circuit is a circuit in which a p-channel transistor and an n-channel transistor are complementarily connected to each other, and examples of the CMOS circuit include, an inverters, NOR gates, NAND gates and the like.

FIG. 2 is a circuit diagram schematically showing a configuration example of a CMOS circuit of Embodiment 1. The CMOS circuit shown in FIG. 2 is an inverter. The inverter INV is constituted by an n-channel transistor TRN and a p-channel transistor TRP.

One of the source and the drain of the n-channel transistor TRN is connected to one of the source and the drain of the p-channel transistor TRP. The other of the source and the drain of the n-channel transistor TRN is connected to a low-potential power supply vss. The low-potential power supply vss may as well be a ground potential. The gate of the n-channel transistor TRN is connected to the gate of the p-channel transistor TRP.

One of the source and the drain of the p-channel transistor TRP is connected to one of the source and the drain of the n-channel transistor TRN. The other one of the source and the drain of the p-channel transistor TRP is connected to a high-potential power supply vdd. The gate of the p-channel transistor TRP is connected to the gate of the n-channel transistor TRN.

The gate of the n-channel transistor TRN and the gate of the p-channel transistor TRP correspond to an input terminal in of the inverter INV. One of the source and the drain of the n-channel transistor TRN and one of the source and the drain of the p-channel transistor TRP correspond to an output terminal out of the inverter INV.

FIGS. 3 and 4 are diagrams each showing a circuit symbol of an inverter. The inverter INV shown in FIG. 2 can as well be represented by as in FIG. 3. When the high-potential power supply vdd and the low-potential power supply vss in FIG. 3 are further omitted, it corresponds to that of FIG. 4.

In Embodiment 1, the n-channel type transistor TRN is formed from a transistor using an oxide semiconductor layer as an active layer (to be referred to as "oxide semiconductor transistor", hereinafter). On the other hand, the p-channel transistor TRP is formed from a transistor using a polycrystalline silicon layer as an active layer (to be referred to as "poly-Si transistor", "polycrystalline silicon transistor" or "polysilicon transistor", hereinafter).

The inverter INV including an n-channel transistor TRN and a p-channel transistor TRP as described above exhibits the following advantages over the case where the n-channel transistor TRN is formed from a poly-Si transistor.

That is, first, the processing step of injecting an impurity (for example, phosphorus (P)) that imparts the n-type polarity is unnecessary. Therefore, the photomask required for the injection process is unnecessary. As a result, the manufacturing time and manufacturing cost of the inverter INV and the display device DSP containing the inverter INV can be reduced.

Second, the oxide semiconductor transistor and the poly-Si transistor can be formed in different layers. Thus, the oxide semiconductor transistor (the n-channel type transistor TRN) and the poly-Si transistor (the p-channel type transistor TRP) can be formed to overlap each other. Thus, the area occupied by the inverter INV can be reduced, and the circuit area including the inverter INV can be reduced. Further, the gate capacitance load of these transistors can be reduced.

Third, by forming the n-channel transistor TRN and the p-channel transistor TRP to overlap, the gates of these transistors can be used common. Therefore, it is possible to form a high-performance inverter INV having a quick switching response.

Figure 5:
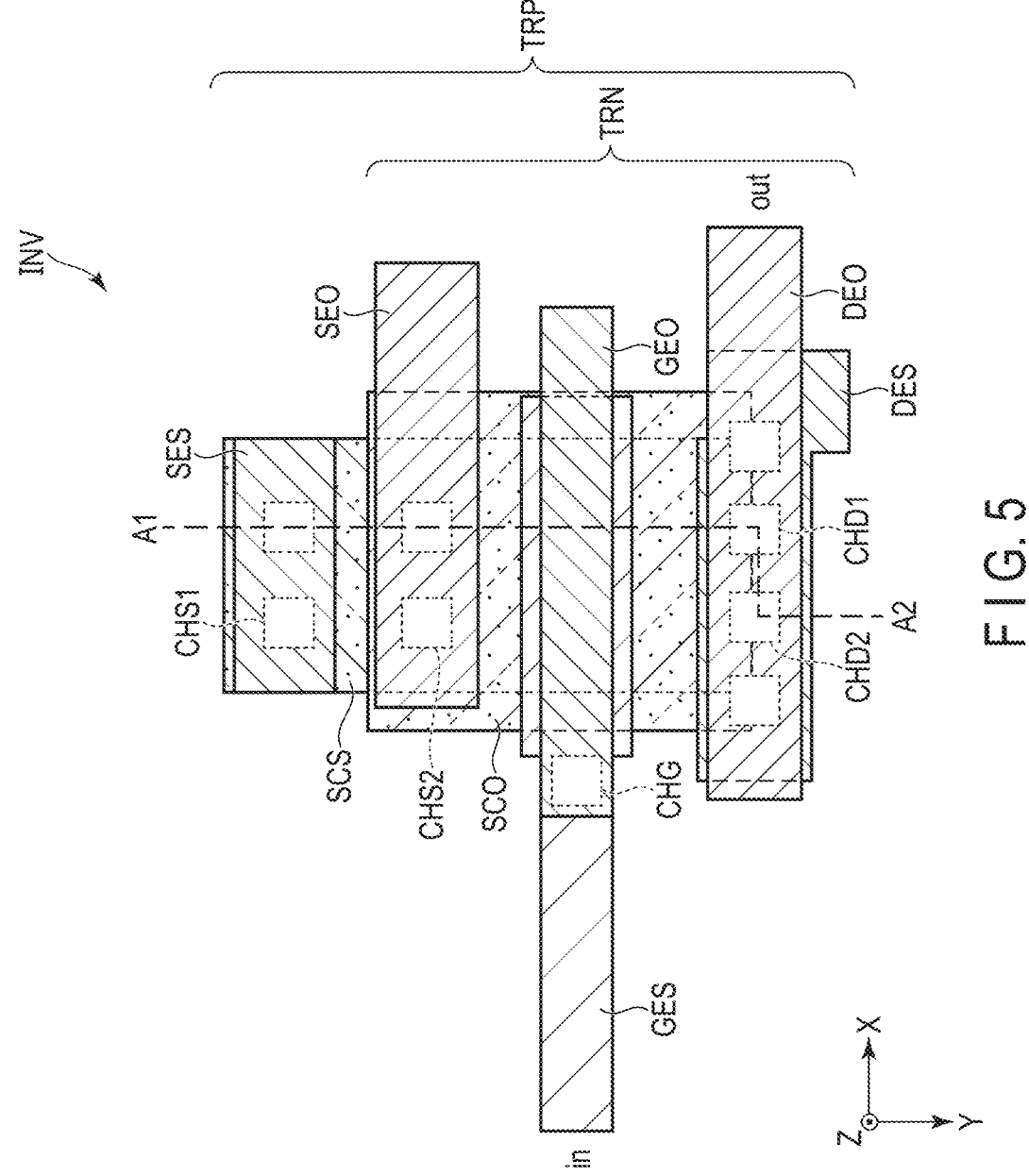
FIG. 5 is a plan view showing the inverter of Embodiment 1.

FIG. 5 is a plan view of the inverter of Embodiment 1. FIG. 6 is a cross-sectional view of the inverter taken along line A1-A2 shown in FIG. 5. In FIG. 6, the insulating layers between the electrodes are omitted for clarity of the drawing.

The p-channel transistor TRP comprises a semiconductor layer SCS, a source electrode SES, a drain electrode DES and a gate electrode GES. The semiconductor layer SCS is formed of a polycrystalline silicon layer (poly-Si) as described above. The p-channel transistor TRP is a poly-Si transistor.

The semiconductor layer SCS comprises a channel formation region CRS, a source region SRS and a drain region DRS. To the source region SRS, the drain region DRS and the channel formation region CRS, an impurity that imparts a p-type, for example, boron (B) is injected. The concentration of the impurity in the source region SRS and the drain region DRS is higher than the concentration of the impurity in the channel formation region CRS.

The end portion of the channel formation region CRS may coincide with the end portion of the gate electrode GES. First, the impurity is injected to the semiconductor layer SCS at a first concentration. Next, the impurity is injected to the semiconductor layer SCS at a second concentration different from the first concentration. When injecting at the second concentration, and using the gate electrode GES as a mask, the channel formation region CRS can be formed. The impurity concentration of the channel formation region CRS corresponds to the first concentration, and the impurity concentration of the source region SRS and drain region DRS corresponds to the second concentration.

The source electrode SES of the p-channel transistor TRP is connected to the semiconductor layer SCS via a contact hole CHS1. The drain electrode DES of the p-channel transistor TRP is connected to the semiconductor layer SCS via a contact hole CHD1. The gate electrode GES of the p-channel transistor TRP overlaps the semiconductor layer SCS between the source electrode SES and the drain electrode DES in plan view.

The n-channel transistor TRN comprises a semiconductor layer SCO, a source electrode SEO, a drain electrode DEO, a gate electrode GEO and a gate electrode GES. The gate electrode GES functions as the top gate of the p-channel transistor TRP and also functions as the bottom gate of the n-channel transistor TRN, as well.

The semiconductor layer SCO is an oxide semiconductor layer. An example of the oxide semiconductor layer is indium gallium zinc oxide (IGZO). The oxide semiconductor layer exhibits n-type characteristics even without impurity injection.

The drain electrode DEO is directly connected to the drain electrode DES and the semiconductor layer SCO via a contact hole CHD2.

The gate electrode GEO overlaps the semiconductor layer SCO between the source electrode SEO and the drain electrode DEO in plan view. The gate electrode GEO is connected to the gate electrode GES via a contact hole CHG. The gate electrode GEO and the gate electrode GES function as the input terminals in of the inverter INV.

The source electrode SES of the p-channel transistor TRP (poly-Si transistor) is connected to the source region SRS of the semiconductor layer SCS via the contact hole CHS1. The source electrode SEO of the n-channel transistor TRP (oxide semiconductor transistor) is connected to the semiconductor layer SCO via a contact hole CHS2.

The source electrode SES and the drain electrode DES of the p-channel transistor TRP and the gate electrode GEO of the n-channel transistor TRN are provided in the same layer. In this embodiment, conductive layers and insulating layers that are formed of the same material and by the same process are provided in the same layer. By forming the source electrode SES, the drain electrode DES and the gate electrode GEO in the same layer, the number of processing steps can be reduced.

As shown in FIGS. 5 and 6, the semiconductor layers SCS and SCO overlap each other in plan view. The drain electrodes DES and DEO overlap each other in plan view. With this configuration, it is possible to reduce the area of the inverter INV. Further, the gate capacitance loads of these transistor TRN and the transistor TRP can be reduced as well.

Configuration Example 1 of Embodiment 1

FIG. 7 is a plan view of another configuration example of the inverter in Embodiment 1. The configuration example shown in FIG. 7 is different from that of FIG. 5 in that the drain electrode is common to both the n-channel transistor and the p-channel transistor.

Figure 8:
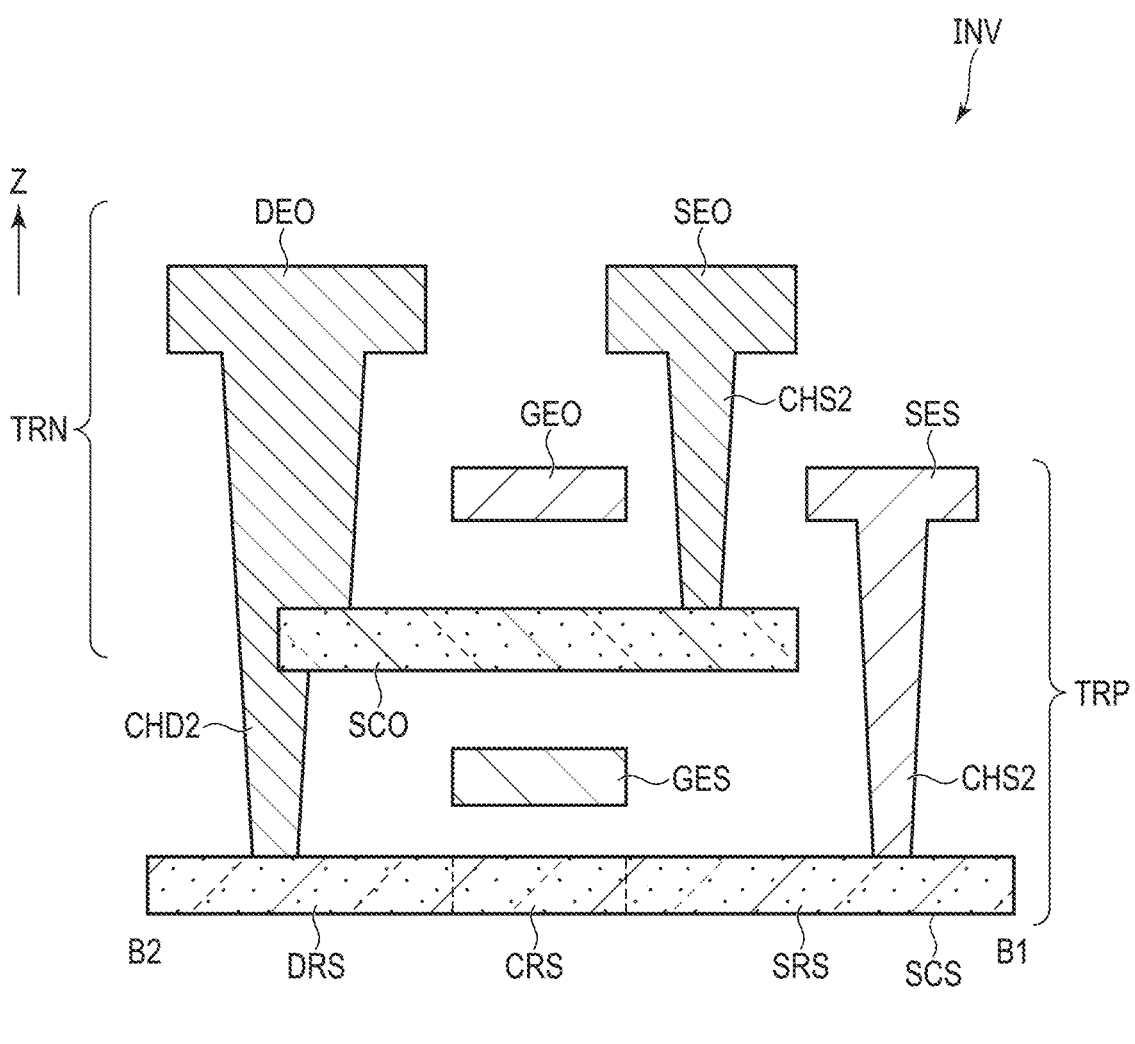
FIG. 8 is a cross-sectional view of the inverter taken along line B1-B2 shown in FIG. 7.

FIG. 7 is a plan view showing the inverter of Configuration Example 1. FIG. 8 is a cross-sectional view of the inverter taken along line B1-B2 shown in FIG. 7. The drain electrode DEO of the n-channel transistor TRN shown in FIGS. 7 and 8 is connected not only to the semiconductor layer SCO but also to the semiconductor layer SCS.

By using the drain electrode DEO of the n-channel transistor TRN as the drain electrode of the p-channel transistor TRP, it is possible to achieve a further reduction in area.

With this configuration example, advantageous effects similar to those of the embodiment can be exhibited.

Configuration Example 2 of Embodiment 1

Figure 9:
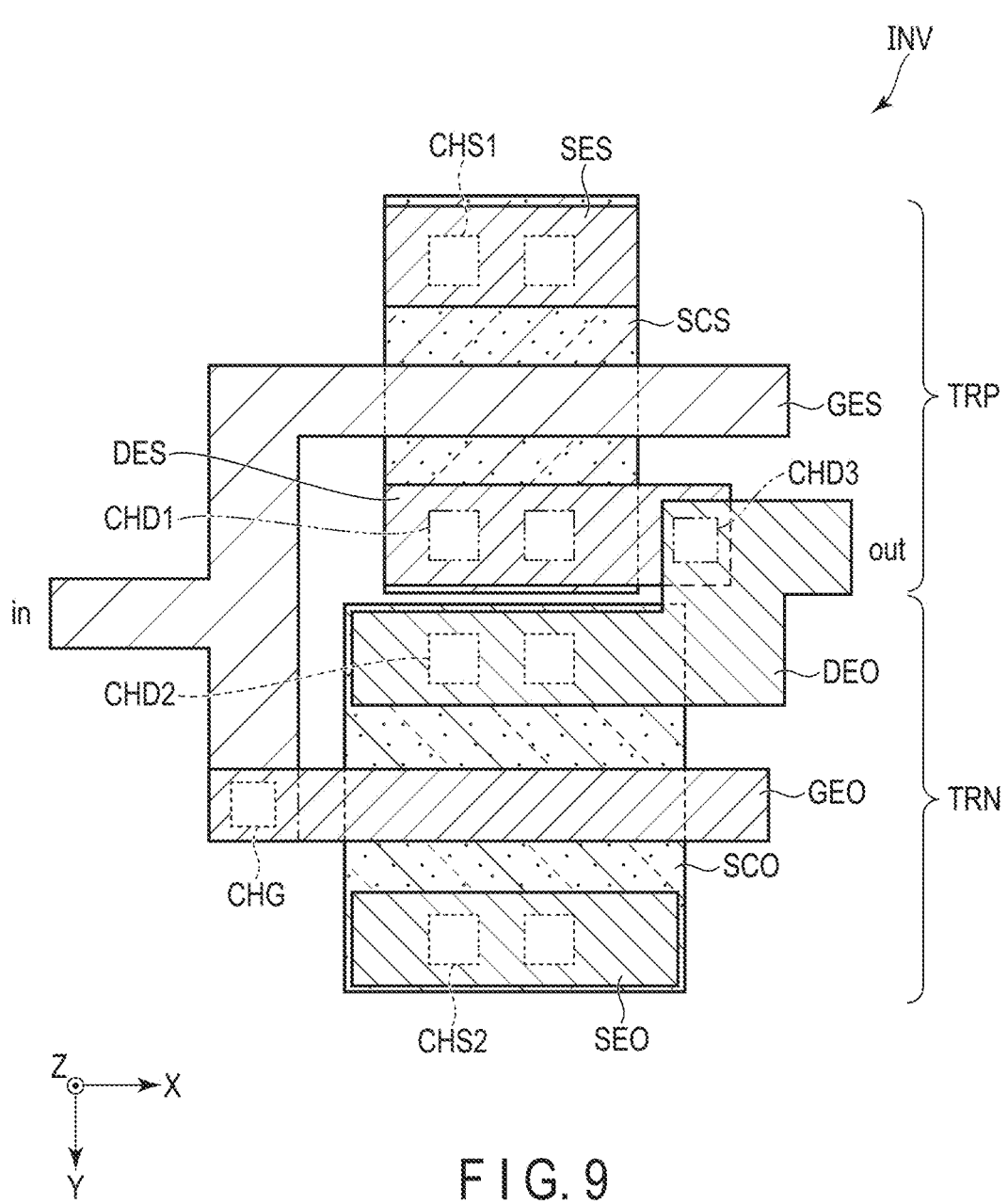
FIG. 9 is a plan view showing another configuration example of the inverter in Embodiment 1.

FIG. 9 is a plan view of another configuration example of the inverter in Embodiment 1. The configuration example shown in FIG. 9 is different from that of FIG. 5 in that the semiconductor layers of the n-channel transistor and the p-channel transistor do not overlap each other in plan view.

The semiconductor layer SCS of the p-channel transistor TRP and the semiconductor layer SCO of the n-channel transistor TRN of the inverter INV shown in FIG. 9 are separated from each other in plan view, as described above.

The source electrode SES of the p-channel transistor TRP is connected to the semiconductor layer SCS via the contact hole CHS1. The drain electrode DES is connected to the semiconductor layer SCS via the contact hole CHD1. The gate electrode GES overlaps the semiconductor layer SCS between the source electrode SES and the drain electrode DES in plan view.

The source electrode SEO of the n-channel transistor TRN is connected to the semiconductor layer SCO via the contact hole CHS2. The drain electrode DEO is connected to the semiconductor layer SCO via the contact hole CHD2. The gate electrode GEO overlaps the semiconductor layer SCO between the source electrode SEO and the drain electrode DEO in plan view.

A part of the gate electrode GES extends to the vicinity of the gate electrode GEO and is connected to the gate electrode GEO via a contact hole CHG.

A part of the drain electrode DEO extends to the vicinity of the drain electrode DES and is connected to the drain electrode DES via a contact hole CHD3.

FIG. 10 is a plan view of another configuration example of the inverter in Embodiment 1. The configuration example shown in FIG. 10 is different from that of FIG. 9 in that the gate electrodes of the n-channel transistor and the p-channel transistor are the same.

In the p-channel transistor TRP shown in FIG. 10, the gate electrode GES1 overlaps the semiconductor layer SCS in plan view. In the n-channel transistor TRN, the gate electrode GES2 overlaps the semiconductor layer SCO in plan view. The gate electrode GES1 and the gate electrode GES2 are formed to be integrated as one piece, thus constituting the gate electrode GES.

In this configuration example as well, advantageous effects similar to those of the embodiment can be exhibited.

Embodiment 2

FIG. 1 is a circuit diagram schematically showing a configuration example of a CMOS circuit of Embodiment 2. The CMOS circuit shown in FIG. 11 is different from that of in that the NOR gate is formed from an n-channel transistor and a p-channel transistor.

Figures 11, 12:
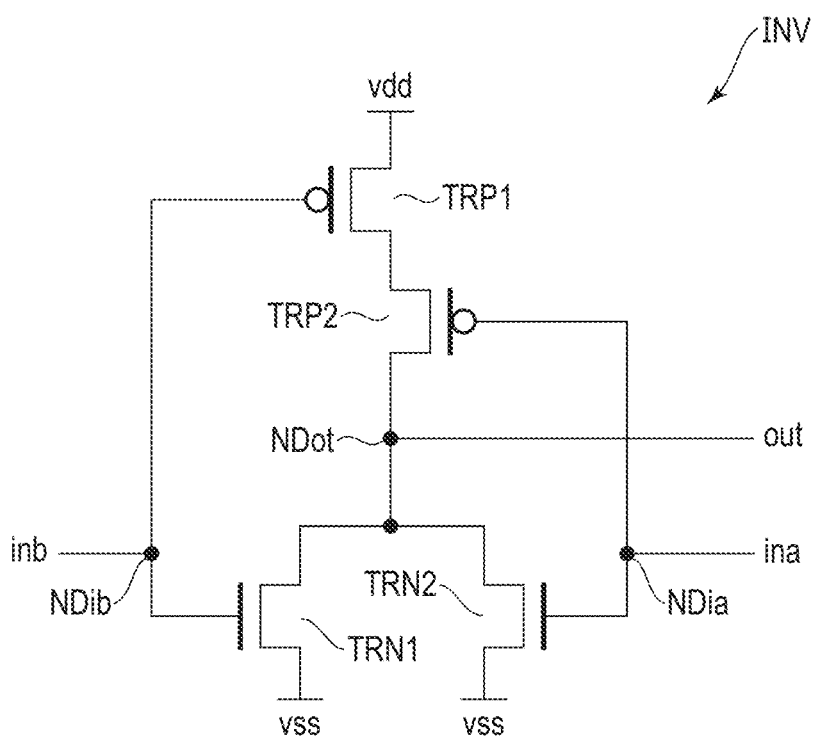
FIG. 11 is a circuit diagram schematically showing a configuration example of a CMOS circuit in Embodiment 2.
FIG. 12 is a diagram showing a circuit symbol of a NOR gate.

The CMOS circuit shown in FIG. 11 is a NOR gate. The NOR gate NR is constituted by an n-channel transistor TRN1 and an n-channel transistor TRN2, and a p-channel transistor TRP1 and a p-channel transistor TRP2.

One of the source and the drain of the p-channel transistor TRP1 is connected to the high-potential power supply vdd. The other one of the source and the drain of the p-channel transistor TRP1 is connected to one of the source and the drain of the p-channel transistor TRP2. The gate of the p-channel transistor TRP1 is connected to the gate of the n-channel transistor and the input terminal inb via a node NDib.

One of the source and the drain of the p-channel transistor TRP2 is connected to one of the source and the drain of the n-channel transistor TRN1, one of the source and the drain of the n-channel transistor TRN2 and the output terminal out via a node NDot. The other one of the source and the drain of the p-channel transistor TRP2 is connected to the other one of the source and the drain of the p-channel transistor TRP1. The gate of the p-channel transistor TRP2 is connected to the gate of the n-channel transistor TRN2 and an input terminal ina via a node NDia.

One of the source and the drain of the n-channel transistor TRN1 is connected to one of the source and the drain of the n-channel transistor TRN2, the other one of the source and the drain of the p-channel transistor TRP2, and the output terminal out via the node NDot. The other one of the source and the drain of the channel transistor TRN1 is connected to a low-potential power supply vss. The low-potential power supply vss is, for example, a ground potential. The gate of the n-channel transistor is connected to the gate of the p-channel transistor TRP1 and the input terminal inb via the node NDib.

One of the source and the drain of the n-channel transistor TRN2 is connected to one of the source and the drain of the n-channel transistor TRN1, and the other of the source and the drain of the p-channel transistor TRP2 and the output terminal out via the node NDot. The other of the source and the drain of the n-channel transistor TRN2 is connected to a low-potential power supply vss. The low-potential power supply vss is, for example, a ground potential. The gate of the n-channel transistor TRN2 is connected to the gate of the p-channel transistor TRP2 and the input terminal ina via the node NDia.

FIG. 12 is a diagram showing a circuit symbol of the NOR gate. The NOR gate NR shown in FIG. 11 can be represented as shown in FIG. 12.

FIG. 13 is a plan view of the NOR gate of Embodiment 2. In the NOR gate NR shown in FIG. 13, the semiconductor layers of the polycrystalline silicon layer and the oxide semiconductor layer overlap each other in plan view.

The p-channel transistor TRP1 of the NOR gate NR comprises a semiconductor layer SCS, a source electrode SES1 and a gate electrode GES1. The p-channel transistor TRP2 comprises a semiconductor layer SCS, a gate electrode GES2 and a drain electrode DES2. The p-channel transistor TRP1 and the p-channel transistor TRP2 share the semiconductor layer SCS. There is no drain electrode of the p-channel transistor TRP1 provided, or no source electrode of the p-channel transistor TRP2 provided. Of the region of the semiconductor layer SCS, the region between the gate electrode GES1 and the gate electrode GES2 in plan view serves as the drain region of the p-channel transistor TRP1 and the source region of the p-channel transistor TRP2.

The n-channel transistor TRN1 of the NOR gate NR comprises a semiconductor layer SCO1, a source electrode SEO1 and a drain electrode DEO1. The n-channel transistor TRN2 comprises a semiconductor layer SCO2, a source electrode SEO2 and a drain electrode DEO2.

The semiconductor layers SCO1 and SCO2 overlap the semiconductor layer SCS in plan view. The gate electrode GEO1 overlaps the gate electrode GES1 in plan view. The gate electrode GEO2 overlaps the gate electrode GES2 in plan view.

The source electrode SES1 of the p-channel transistor TRP1 is connected to the semiconductor layer SCS via the contact hole CHS1. The drain electrode DES2 of the p-channel transistor TRP2 is connected to the semiconductor layer SCS via the contact hole CHS1.

The source electrode SEO1 of the n-channel transistor TRN1 and the source electrode SEO2 of the n-channel transistor TRN2 are formed to be integrated with each other as one body and are connected to the low potential power supply vss, which is not shown in the figure. The source electrode SEO1 of the n-channel transistor TRN1 is connected to a semiconductor layer SCO1 via the contact hole CHS2.

The drain electrode DEO1 of the n-channel transistor TRN1 and the drain electrode DEO2 of the n-channel transistor TRN2 are formed to be integrated with each other as one body to constitute an output terminal out. The drain electrode DEO1 of the n-channel transistor TRN1 is connected to the semiconductor layer SCO1 via the contact hole CHD2.

The gate electrode GEO1 of the n-channel transistor TRN1 overlaps the semiconductor layer SCO1 between the source electrode SEO1 and the drain electrode DEO1 in plan view. The gate electrode GEO1 is connected to the gate electrode GES1 via the contact hole CHG1. The gate electrodes GEO1 and GES1 constitute the input terminal ina.

The source electrode SEO2 of the n-channel transistor TRN2 and the source electrode SEO1 of the n-channel transistor TRN1 are formed to be integrated with each other as one body and connected to a low potential power supply vss, which is not shown in the figure. The source electrode SEO2 of the n-channel transistor TRN2 is connected to the semiconductor layer SCO2 via a contact hole CHS3.

The drain electrode DEO2 of the n-channel transistor TRN2 and the drain electrode DEO1 of the n-channel transistor TRN1 are formed to be integrated with each other as one body to constitute an output terminal out. The drain electrode DEO2 of the n-channel transistor TRN2 is connected to the semiconductor layer SCO2 through the contact hole CHD2. The drain electrode DEO2 is connected to the drain electrode DES2 via the contact hole CHD3.

Note that the drain electrode DEO2 may as well be connected to the drain electrode DES2 and the semiconductor layer SCO2 as in the case shown in FIG. 6. Or, as in the case of FIG. 8, the drain electrode DES2 may not be provided and the drain electrode DEO2 may be connected to the semiconductor layers SCS and SCO2.

The gate electrode GEO2 of the n-channel transistor TRN2 overlaps the semiconductor layer SCO2 between the source electrode SEO2 and the drain electrode DEO2 in plan view. The gate electrode GEO2 is connected to the gate electrode GES2 via a contact hole CHG2. The gate electrode GEO2 and the gate electrode GES2 constitute an input terminal inb.

In Embodiment 2 as well, advantageous effects similar to those of Embodiment 1 can be exhibited. That is, first, the processing step of injecting an impurity (for example, phosphorus (P)) that imparts an n-type polarity becomes unnecessary. Therefore, the photomask required for the injection process becomes unnecessary. As a result, the manufacturing time and manufacturing cost of the NOR gate NR and the display device DSP comprising the NOR gate NR can be reduced.

Second, it is possible to form the oxide semiconductor transistors (the n-channel type transistor TRN1 and the n-channel type transistor TRN2) and poly-Si transistors (the p-channel type transistor TRP1 and the p-channel type transistor TRP2) in different layers. With this configuration, the oxide semiconductor transistors and the poly-Si transistors can be formed to overlap each other. Thus, the area occupied by the NOR gate NR can be reduced, and the circuit area including the NOR gate NR can be reduced. Further, the gate capacitance load of these transistors can be reduced.

Third, by forming the n-channel transistor TRN1 and the n-channel transistor TRN2, and the p-channel transistor TRP1 and the channel transistor TRP2 to overlap each other, the gates of these transistors can be used common. Thus, it is possible to form a high-performance NOR gate NR with a quick switching response.

Configuration Example 1 of Embodiment 2

FIG. 14 is a plan view of another configuration example of a NOR gate of Embodiment 2. The configuration example shown in FIG. 14 is different from that of FIG. 13 in that the semiconductor layers of the n-channel transistor and the p-channel transistor do not overlap each other in plan view.

In the NOR gate NR shown in FIG. 14, the semiconductor layers SCS of the p-channel transistor TRP1 and the p-channel transistor TRP2, the semiconductor layer SCO1 of the n-channel transistor TRN1 and the semiconductor layer SCO2 of the n-channel transistor TRN2 do not overlap each other and but they separated from each other in plan view.

The source electrode SES1 of the p-channel transistor TRP1, the drain electrode DES2 of the p-channel transistor TRP2, the gate electrode GEO1 of the n-channel transistor TRN1, and the gate electrode GEO2 of the n-channel transistor TRN2 are formed in the same layer.

The source electrode SEO1 of the n-channel transistor TRN1 is connected to the semiconductor layer SCO1 via the contact hole CHS2. The source electrode SEO1 of the n-channel transistor TRN1 is connected to the low-potential power supply vss, which is not shown in the drawing. The drain electrode DEO1 of the n-channel transistor TRN1 is connected to the semiconductor layer SCO1 via the contact hole CHD2.

The source electrode SEO2 of the n-channel transistor TRN2 is connected to the semiconductor layer SCO2 via the contact hole CHS3. The source electrode SEO2 of the n-channel transistor TRN2 is connected to the low-potential power supply vss, which is not shown in the drawing. The drain electrode DEO2 of the n-channel transistor TRN2 is connected to the semiconductor layer SCO2 via the contact hole CHD3.

The drain electrodes DEO1 and DEO2 are connected to the drain electrode DES2 of the p-channel transistor TRP2 via a contact hole, which is not shown.

This configuration example as well has a configuration similar to that of Embodiment 1.

Embodiment 3

FIG. 15 is a circuit diagram schematically showing a configuration example of a CMOS circuit of Embodiment 3. The CMOS circuit shown in FIG. 15 is different from that of FIG. 2 in that the n-channel transistor and the p-channel transistor form a NAND gate.

The CMOS circuit shown in FIG. 15 is a NAND gate. The NAND gate NND is constituted by an n-channel transistor TRN1 and an n-channel transistor TRN2, and a p-channel transistor TRP1 and a p-channel transistor TRP2.

One of the source and the drain of the p-channel transistor TRP1 is connected to the high potential power supply vdd.

The other one of the source and the drain of the p-channel transistor TRP1 is connected to the other one of the source and the drain of the p-channel transistor TRP2 and, via the node NDot, to the other one of the source and the drain of the p-channel transistor TRP2 and the output terminal out.

The gate of the p-channel transistor TRP1 is connected to the gate of the n-channel transistor TRN2 and the input terminal inb via the node NDib.

One of the source and the drain of the p-channel transistor TRP2 is connected to the high potential power supply vdd. The other one of the source and the drain of the p-channel transistor TRP2 is connected to the other one of the source and the drain of the p-channel transistor TRP1 and, via the node NDot, to the other one of the source and the drain of the n-channel transistor TRN1 and to the output terminal out.

The gate of the p-channel transistor TRP2 is connected to the gate of the n-channel transistor TRN1 and the input terminal ina via the node NDia.

One of the source and the drain of the n-channel transistor TRN1 is connected to the other one of the source and the drain of the n-channel transistor TRN2. The other one of the source and the drain of the n-channel transistor TRN1 is connected, via the node Not, to the other one of the source and the drain of the p-channel transistor TRP2, the other one of the source and the drain of the p-channel transistor TRP1, and the output terminal out.

The gate of the n-channel transistor TRN1 is connected to the gate of the p-channel transistor TRP2 and the input terminal ina via the node NDia.

One of the source and the drain of the n-channel transistor TRN2 is connected to the low-potential power supply vss. The other one of the source and the drain of the n-channel transistor TRN2 is connected to one of the source and the drain of the n-channel transistor TRN1.

The gate of the n-channel transistor TRN2 is connected to the gate of the p-channel transistor TRP1 and the input terminal inb via the node NDib.

FIG. 16 is a diagram showing a circuit symbol of a NAND gate. The NAND gate NND shown in FIG. 15 can be represented by as shown in FIG. 16.

FIG. 17 is a plan view of a NAND gate of Embodiment 3. In the NAND gate NND shown in FIG. 17, the semiconductor layer of the polycrystalline silicon layer and the semiconductor layer of the oxide semiconductor layer overlap each other in plan view.

The p-channel transistor TRP1 of the NAND gate NND comprises a semiconductor layer SCS1, a source electrode SES1, a drain electrode DES1 and a gate electrode GES1. The source electrode SES1 is connected to the semiconductor layer SCS1 via a contact hole CHS1. The drain electrode DES1 is connected to the semiconductor layer SCS1 via a contact hole CHD1. The gate electrode GES1 overlaps the semiconductor layer SCS1 between the source electrode SES1 and the drain electrode DES1 in plan view.

The p-channel transistor TRP2 comprises a semiconductor layer SCS2, a source electrode SES2, a drain electrode DES2 and a gate electrode GES2. The source electrode SES2 is connected to the semiconductor layer SCS2 via a contact hole CHS2. The drain electrode DES2 is connected to the semiconductor layer SCS2 via a contact hole CHD2. The gate electrode GES2 overlaps the semiconductor layer SCS2 between the source electrode SES2 and the drain electrode DES2 in plan view.

The n-channel transistor TRN1 of the NAND gate NND comprises a semiconductor layer SCO, a source electrode SEO1 and a gate electrode GEO1. The source electrode SEO1 is connected to the semiconductor layer SCO via a contact hole CHS3. The source electrode SEO1 is connected to a low-potential power supply vss.

The n-channel transistor TRN2 comprises a semiconductor layer SCO, a drain electrode DEO2 and a gate electrode GEO2. The drain electrode DEO2 is connected to the semiconductor layer SCO via a contact hole CHD3. The n-channel transistor TRN1 and the n-channel transistor TRN2 share the semiconductor layer SCO.

The drain electrode DEO2 may be connected to the drain electrode DES2 and the semiconductor layer SCO as in the case shown in FIG. 6. Or, as in the case of FIG. 8, the drain electrode DES2 may not be provided and the drain electrode DEO2 may be connected to the semiconductor layers SCS2 and SCO.

The drain electrode of the n-channel transistor TRN1 and the source electrode of the n-channel transistor TRN2 are not provided. Of the region of the semiconductor layer SCO, the region between the gate electrode GEO1 and the gate electrode GEO2 in plan view serves as the drain area of the n-channel transistor TRN1 and the source area of the n-channel transistor TRN2.

The source electrodes SES1 and SES2 are formed to be integrated with each other as one body and connected to a high potential power supply vdd. The drain electrode DEO2 is connected to the drain electrode DES2 via a contact hole CHD3. The drain electrode DEO2 is connected to the drain electrode DES1 via a contact hole CHD4.

The gate electrode GEO1 overlaps the gate electrode GES1 in plan view. The gate electrode GEO1 is connected to the gate electrode GES1 via the contact hole CHG1. The gate electrode GES1 and the gate electrode GEO1 constitute an input terminal ina.

The gate electrode GEO2 overlaps the gate electrode GES2 in plan view. The gate electrode GEO2 is connected to the gate electrode GES2 via a contact hole CHG2. The gate electrode GES2 and the gate electrode GEO2 constitute an input terminal inb.

The source electrode SES1 and the source electrode SES2 formed to be integrated with each other as one body, and the gate electrode GEO1 and the gate electrode GEO2 are formed in the same layer.

In Embodiment 3, advantageous effects similar to those of Embodiment 1 can be exhibited. That is, first, the processing step of injecting an impurity (for example, phosphorus (P)) that imparts the n-type polarity becomes unnecessary. Therefore, the photomask required for the injection process becomes unnecessary. As a result, the manufacturing time and manufacturing cost of the NAND gate NND and the display device DSP comprising the same can be reduced.

Second, it is possible to form the oxide semiconductor transistors (the n-channel type transistor TRN1 and the n-channel type transistor TRN2) and the poly-Si transistors (the p-channel type transistor TRP1 and the p-channel type transistor TRP2) in different layers. With this configuration, the oxide semiconductor transistors and the poly-Si transistors can be formed to overlap each other. Therefore, the area occupied by the NAND gate NND can be reduced, and the circuit area including the NAND gate NND can be reduced. Further, the gate capacitance load of these transistors can be reduced.

Third, by forming the n-channel transistor TRN1 and the n-channel transistor TRN2, and the p-channel transistor TRP1 and the p-channel transistor TRP2 to overlap each other, the gates of these transistors can be used common. Therefore, it is possible to form a high-performance NAND gate NND with a quick switching response.

Configuration Example 1 of Embodiment 3

FIG. 18 is a plan view of another configuration example of a NAND gate in Embodiment 3. The configuration example shown in FIG. 18 is different from that of FIG. 17 in that the semiconductor layers of the n-channel transistor and the p-channel transistor do not overlap each other in plan view.

In the NAND gate NND shown in FIG. 18, the semiconductor layer SCS1 of the p-channel transistor TRP1, the semiconductor layer SCS2 of the p-channel transistor TRP2, and the semiconductor layers SCO of the n-channel transistor TRN1 and the n-channel transistor TRN2 do not overlap each other and separated from each other in plan view.

The source electrode SES1 and the drain electrode DES1 of the p-channel transistor TRP1, the source electrode SES2 and drain electrode DES2 of the p-channel transistor TRP2, the gate electrode GEO1 of the n-channel transistor TRN1 and the gate electrode GEO2 of the n-channel transistor TRN2 are formed in the same layer.

The source electrode SES1 of the p-channel transistor TRP1 is connected to the semiconductor layer SCS1 via the contact hole CHS1. The source electrode SES1 of the p-channel transistor TRP1 is connected to a high-potential power source vdd, which is now shown in the drawing. The drain electrode DES1 of the p-channel transistor TRP1 is connected to the semiconductor layer SCS1 via a contact hole CHD1.

The source electrode SES2 of the p-channel transistor TRP2 is connected to the semiconductor layer SCS2 via the contact hole CHS2. The source electrode SEO2 of the p-channel transistor TRP2 is connected to a high-potential power source vdd, which is now shown in the drawing. The drain electrode DES2 of the p-channel transistor TRP2 is connected to the semiconductor layer SCS2 via a contact hole CHD2.

The gate electrode GEO1 is connected to the gate electrode GES1 via the contact hole CHG1. The gate electrode GEO1 and the gate electrode GES1 overlap each other only near the contact hole CHG1 and do not in other regions.

The gate electrode GEO2 is connected to the gate electrode GES2 via the contact hole CHG2. The gate electrode GEO2 and the gate electrode GES2 overlap each other only near the contact hole CHG2, and do not in other regions.

The drain electrode DEO2 is connected to the drain electrode DES1 of the p-channel transistor TRP1 and the drain electrode DES2 of the p-channel transistor TRP2 via contact holes, which are not shown.

This configuration example as well has a configuration similar to that of this embodiment.

In this disclosure, the drain electrode DES and the drain electrode DEO shown in FIGS. 5 and 7 may as well referred to as the first drain electrode and the second drain electrode, respectively.

In this disclosure, the p-channel transistor TRP1 and the p-channel transistor TRP2 shown in FIGS. 13 and 17 may as well be referred to as the first p-channel transistor and the second p-channel transistor, respectively. Further, the n-channel transistor TRN1 and the n-channel transistor TRN2 may as well be referred to as the first n-channel transistor and the second n-channel transistor, respectively.

In this disclosure, the drain electrode DES2 of the p-channel transistor TRP2 shown in FIGS. 13 and 17 may as well be referred to as the first drain electrode. The drain electrode DES2 of the p-channel transistor TRN2 may as well be referred to as the second drain electrode.

In this disclosure, the gate electrode GES1 of the p-channel transistor TRP1, the gate electrode GEO1 of the n-channel transistor TRN1, the gate electrode GES2 of the p-channel transistor TRP2, and the gate electrode GEO2 of the n-channel transistor TRN2 shown in FIGS. 13 and 17 may as well be referred to as the first gate electrode, second gate electrode, third gate electrode, and fourth gate electrode, respectively.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A CMOS circuit comprising:
a p-channel type transistor including a polycrystalline silicon layer; and
an n-channel type transistor including an oxide semiconductor layer, wherein
the p-channel transistor and the n-channel transistor are complementarily connected to each other,
the polycrystalline silicon layer and the oxide semiconductor layer overlap each other in plan view,
the CMOS circuit is an inverter comprising one of the p-channel type transistor and one of the n-channel type transistor, a first drain electrode of the p-channel transistor is connected to the polycrystalline silicon layer,
a second drain electrode of the n-channel transistor is connected to the oxide semiconductor layer and the first drain electrode, and
a gate electrode of the p-channel transistor and a gate electrode of the n-channel transistor overlap each other in plan view.

2. The CMOS circuit according to claim 1, wherein the polycrystalline silicon layer of the p-channel transistor contains an impurity which impart a p-type.

3. A CMOS comprising:
a p-channel type transistor including a polycrystalline silicon layer; and
an n-channel type transistor including an oxide semiconductor layer, wherein
the p-channel transistor and the n-channel transistor are complementarily connected to each other,
the polycrystalline silicon layer and the oxide semiconductor layer overlap each other in plan view,
the CMOS circuit is an inverter comprising one of the p-channel type transistor and one of the n-channel type transistor,
a drain electrode of the n-channel transistor is connected to the oxide semiconductor layer and the polycrystalline silicon layer, and
a gate electrode of the p-channel transistor and a gate electrode of the n-channel transistor overlap each other in plan view.

4. The CMOS circuit according to claim 3, wherein the polycrystalline silicon layer of the p-channel transistor contains an impurity which imparts a p-type.

* * * * *